US006603331B1

(12) United States Patent
Om'Mani et al.

(10) Patent No.: US 6,603,331 B1
(45) Date of Patent: Aug. 5, 2003

(54) LOW-VOLTAGE NON-DEGENERATIVE TRANSMITTER CIRCUIT

(75) Inventors: Henry A. Om'Mani, Albuquerque, NM (US); Thomas J. Davies, Jr., Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/024,841

(22) Filed: Dec. 18, 2001

(51) Int. Cl.$^7$ ............................................. H03K 19/094
(52) U.S. Cl. .............................. 326/38; 326/16; 326/81; 326/83; 714/724; 714/725; 365/185.18; 365/185.22
(58) Field of Search ................................ 326/16, 38–41, 326/81, 83; 714/724, 725; 365/185.18, 185.22

(56) References Cited

U.S. PATENT DOCUMENTS

| | | | | |
|---|---|---|---|---|
| 5,113,093 A | * | 5/1992 | Tashiro et al. ................. 326/16 |
| 5,524,114 A | * | 6/1996 | Peng ............................ 714/724 |
| 5,651,011 A | * | 7/1997 | Keeth .......................... 714/724 |
| 5,889,701 A | | 3/1999 | Kang et al. |
| 6,102,963 A | * | 8/2000 | Agrawal ....................... 716/17 |
| 6,114,843 A | | 9/2000 | Olah |
| 6,288,526 B1 | | 9/2001 | Olah |

OTHER PUBLICATIONS

Xilinx Advance Product Specification DS012 (v1.4) "CoolRunner XPLA3 CPLD" Apr. 11, 2001, pp. 1–10.

* cited by examiner

Primary Examiner—Michael Tokar
Assistant Examiner—Vibol Tan
(74) Attorney, Agent, or Firm—Arthur J. Behiel; Edel M. Young; Justin Liu

(57) ABSTRACT

A CPLD employs a low-voltage, non-degenerative transmitter circuit to eliminate the need for a dedicated control pin to provide the relatively high voltage levels required to verify the program states of programmable memory cells. Eliminating the need for a dedicated control pin frees up valuable chip real estate for the inclusion of an additional general-purpose input/output pin.

15 Claims, 4 Drawing Sheets

LOW-VOLTAGE NON-DEGENERATIVE TRANSMITTER CIRCUIT

BACKGROUND

Complex programmable logic devices (CPLDs) are well-known integrated circuits that may be programmed to perform various logic functions. Numerous types of memory elements may be used in CPLD architectures to provide programmability. One such memory element, known as a flash memory cell, is both electrically programmable and erasable. Program and erase are performed on a plurality of flash memory cells using either Fowler-Nordheim tunneling or hot electron injection for programming and Fowler-Nordheim tunneling for erase. Flash memories can also be in-system programmable (ISP). An ISP device can be programmed, erased, and can have its program state verified after it has been connected, such as by soldering, to a system printed circuit board. Some CPLDs do not have ISP capability and must be programmed externally (outside the system) by programming equipment.

Circuit features grow ever smaller with improvements in integrated-circuit process technology. The reduction in feature size improves device performance while at the same time reducing cost and power consumption. Unfortunately, smaller feature sizes also increase a circuit's vulnerability to over-voltage conditions. Among the more sensitive elements in a modern integrated circuit are the gate oxide layers of the various MOS transistors. In modern devices these layers are very thin, and are consequently easily ruptured by excessive voltage levels. Modern circuits with small feature sizes therefore employ significantly lower source voltages than was common only a few years ago. For example, modern 0.18-micron processes employ supply voltages no greater than 2 volts.

The voltages required to program and erase flash memory cells are dictated by physical properties of the materials used to fabricate memory cells. Unfortunately, these physical properties have not allowed the voltages required to program, erase, and verify the program state of a memory cell to be reduced in proportion to reductions in supply voltages. For example, modern flash memory cells adapted for use with a 0.18-micron processes require program and erase voltages as high as 14 volts, a level far exceeding the required supply voltage. Such memory cells are verified using a range of voltages from about zero volts to about 4.5 volts, the upper end of which is also potentially damaging to sensitive circuits. For a more detailed treatment of program, erase, and verify procedures, see U.S. Pat. No. 5,889,701, which is incorporated herein by reference.

FIG. 1A (prior art) depicts a conventional CPLD 100. CPLD 100 includes a number of input/output (I/O) circuits 105 that may be configured as either input circuits or output circuits by programming appropriate ones of a collection of memory cells 110. Memory cells 110 are depicted in a box for simplicity: they are typically distributed throughout CPLD 100. CPLD 100 includes many additional functional components that are omitted here for brevity. For a more detailed discussion of exemplary CPLDs, see U.S. Pat. No. 6,288,526 and "CoolRunner® XPLA3 CPLD, Advance Product Specification," DS012 (v1.4), Apr. 11, 2001, both of which are incorporated herein by reference.

I/O circuits 105 are externally accessible via a number of device I/O pins 115. Pins 115 are used both when CPLD 100 is operating as a programmed logic circuit (i.e., is in a logic mode) and during program and verify procedures performed when CPLD 100 is in the test mode. A power line 120 conveys a power-supply voltage VDD from an external supply pin 122 to I/O circuits 105 and the other logic circuits (not shown). CPLD 100 may also include internal voltage generators for developing relatively high voltages to support ISP functionality.

The I/O circuit 105 in the upper left-hand corner of CPLD 120 is shown to include a device input circuit 125 connected to supply line 120. Input circuit 125 has a device input terminal adapted to receive input signals from one of device pins 115 and an output terminal 135 adapted to convey signals to internal logic (not shown). Each I/O circuit 105 also includes an output circuit 130 adapted to convey signals from the internal logic to the respective device pin 115.

During program-state verification, an analog verification signal VFY of between about 0 and 4.5 volts is applied to the control gates of various ones of memory cells 110 via a transmitter circuit 145 and some steering logic 140. As with other designations in the present disclosure, VFY refers to both the verification signal and the corresponding circuit node. Whether a given designation refers to a node or a signal will be clear from the context.

A high-voltage signal HVIN activates transmitter circuit 145 when brought high to pass the verify signal VFY to steering logic 140. As explained below in connection with FIG. 1B, high-voltage signal HVIN is even higher than the maximum verify voltage VFY, and consequently approaches a level that might damage circuits—such as delicate gate oxides—internal to input circuit 125. High-voltage signal HVIN is therefore brought onto CPLD 100 via a dedicated pin 121.

FIG. 1B details transmitter circuit 145 of FIG. 1A, including a level shifter 150 and an NMOS output transistor 155. Level shifter 150 shifts a digital control signal CTRL that varies between zero volts and VDD to a similar control signal HV that varies between zero volts and the verify voltage VFY. Control signal CTRL turns off the switched VFY signal VFY_S while steering logic 140 selects the next bit line to which the verify signal VFY will be applied.

Due to the threshold voltage Vth of transistor 155, verify voltage VFY_S will be less than the externally applied verify voltage VFY unless the gate of transistor 155 is brought well above verify voltage VFY. Verify voltage VFY may exceed VDD, and the voltage applied to the gate of transistor 155 must be higher still.

Unfortunately, input circuits 125 in state-of-the-art CPLDs may contain device features too small to accommodate the relatively high voltage HVIN required on device pin 120. For example, if I/O circuits 105 are manufactured using a conventional 0.18-micron process, voltages over about 5 volts can damage input transistors within input circuit 125. The maximum verify voltages VFY required for memory cells 110 in such circuits is approximately 4.5 volts, so verify voltages VFY can be connected to the input terminal of input circuit 125 as shown; however, the threshold voltage required to pass a 4.5 volt signal through transistor 145 without substantial degradation will be approximately 6 or 7 volts. A dedicated device pin 120 is therefore provided to convey this relatively high voltage HUIN.

Integrated circuits are becoming ever more densely populated as processing technology improves. As circuit features grow smaller, the number of physical pads that fit on the die surface becomes a limiting factor on the amount of logic instantiated on a circuit die. Due to the pad-limited nature of modern devices, device pins are at a premium. It is therefore undesirable to provide a dedicated pin 120 for the purposes of test at the expense of a general purpose I/O circuit 105.

SUMMARY

A CPLD in accordance with the invention employs a low-voltage, non-degenerative transmitter circuit to eliminate the need for a dedicated control pin to provide the relatively high voltage levels required to verify the program states of programmable memory cells. Eliminating the need for a dedicated control pin frees up valuable chip real estate for the inclusion of an additional general-purpose input/output pin.

The appended claims, and not this summary, define the scope of the invention.

DETAILED DESCRIPTION

Figure 1A:
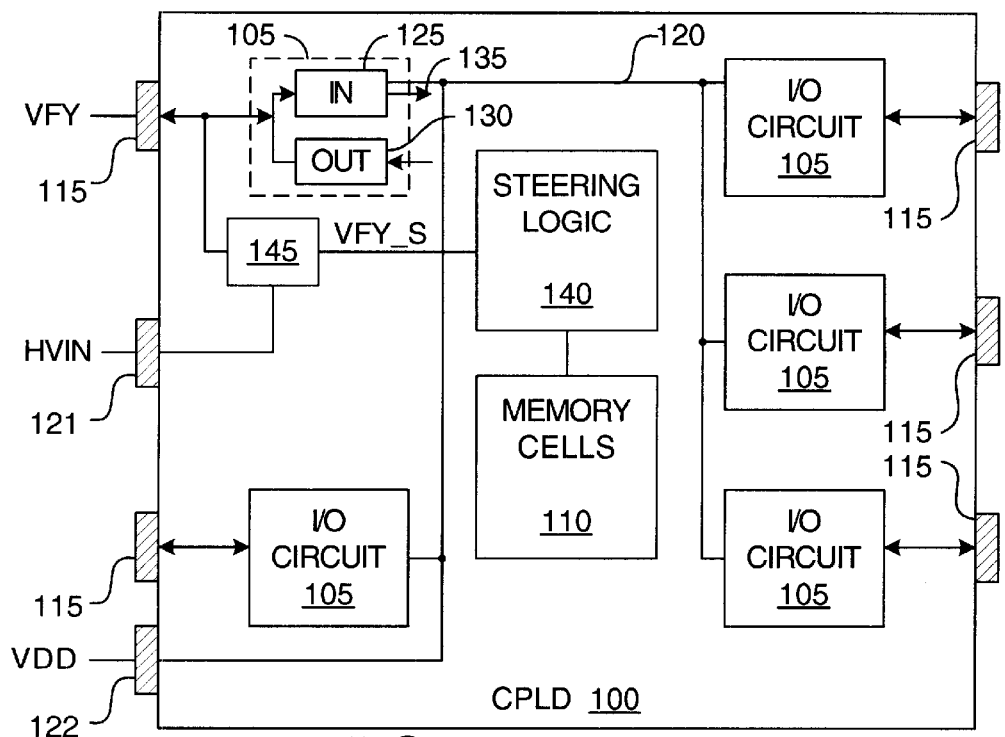
FIG. 1A (prior art) depicts a conventional CPLD 100.
Figure 1B:
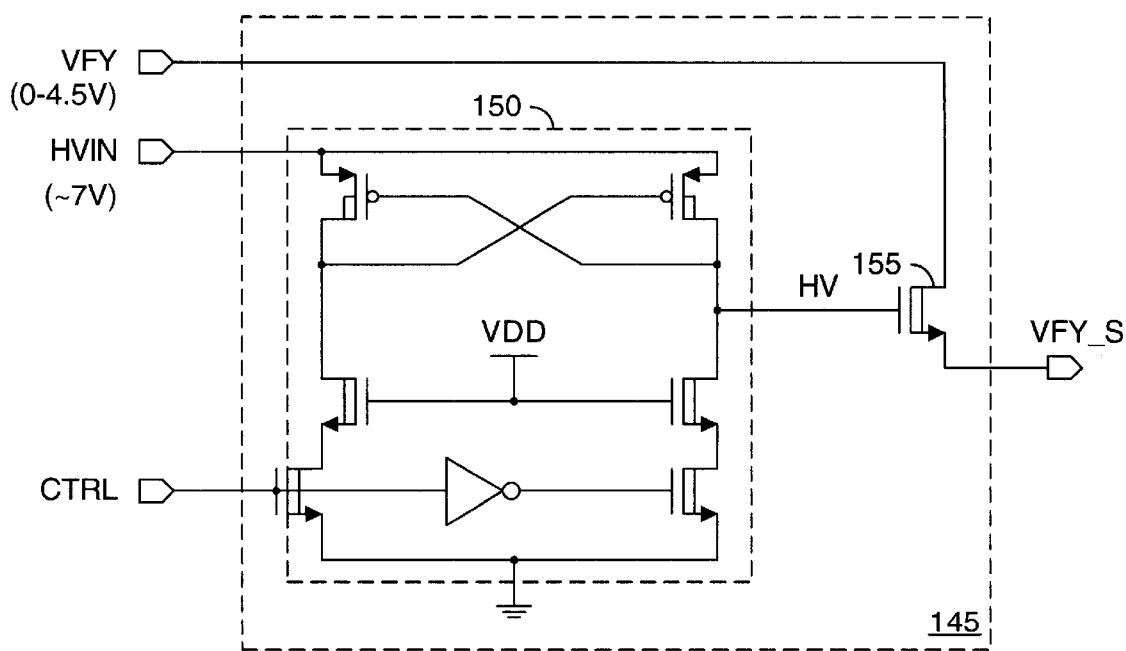
FIG. 1B details transmitter circuit 145 of FIG. 1A, including a level shifter 150 and an NMOS output transistors 155.
Figure 2:
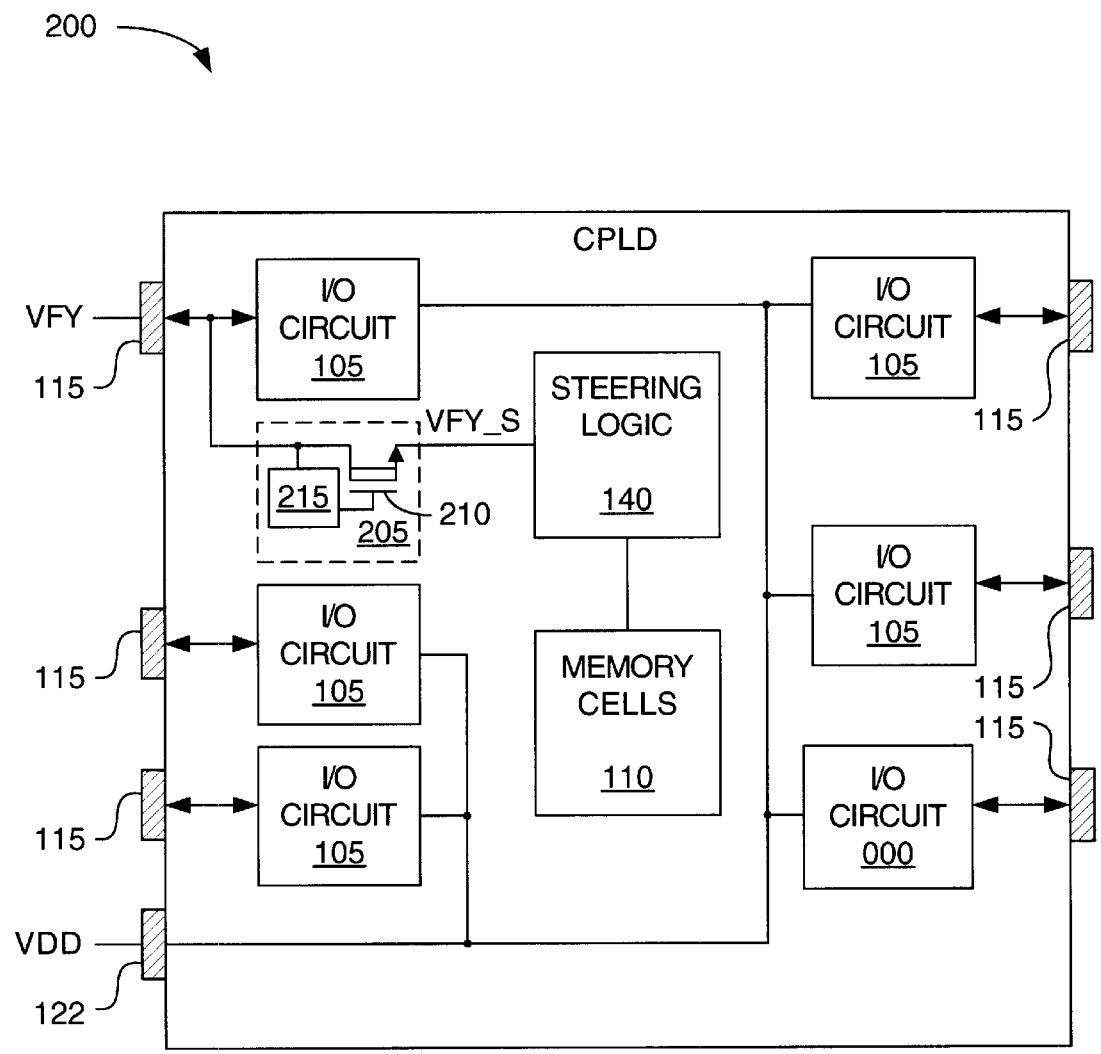
FIG. 2 depicts a CPLD 200 in accordance with one embodiment of the invention.

FIG. 2 depicts a CPLD 200 similar to CPLD 100 of FIG. 1, like numbered elements being the same. In accordance with the invention, transmitter circuit 145 is replaced with a transmitter circuit 205 that eliminates the need for a dedicated pin to provide the voltage HUIN while verifying the program states of memory cells 110. Transmitter circuit 205 includes a transistor 210 that gates verify voltage VFY to steering logic 140. Circuit 205 also includes an amplifier 215 that uses verify voltage VFY to develop a relatively high voltage on the gate of transistor 210, thereby enabling transistor 210 to convey verify voltage VFY to steering logic 140 without a significant voltage drop.

Figure 3:
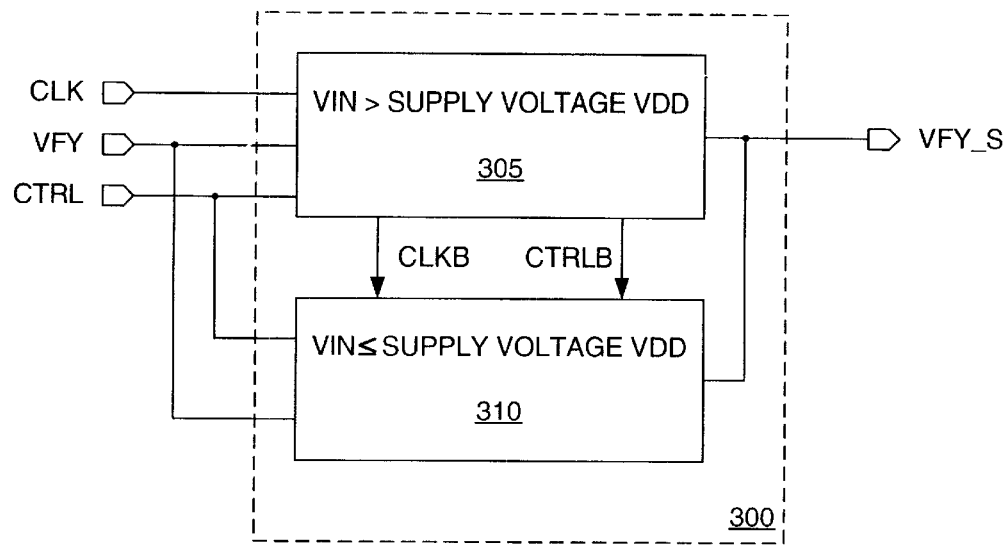
FIG. 3 depicts a transmitter circuit 300 that may be used in place of transmitter circuit 205 of FIG. 2.

FIG. 3 depicts a transmitter circuit 300 that may be used in place of transmitter circuit 205 of FIG. 2 in one embodiment of the invention. Circuit 300 includes a first switch section 305 and a second switch section 310.

The first switch section 305 is adapted to pass verify voltage VFY when VFY is greater than supply voltage VDD, while the second switch section 310 is adapted to pass verify voltage VFY when VFY is less than or equal to supply voltage VDD.

In addition to verify voltage VFY, circuit 300 receives a clock signal CLK and a control signal CTRL. These signals can be provided externally via conventionally I/O circuits, or can be developed using logic internal to CPLD 200. Circuit 300 uses these three input signals, as detailed below in connection with FIGS. 4 and 5, to develop a controlled verify voltage VFY_S for verifying the program states of memory cells 110 (FIG. 2). Inverted versions of signals CLK and CTRL, CLKB and CTRLB, pass from switch section 305 to switch section 310 for reasons that will be evident from the following discussion.

Figure 4:
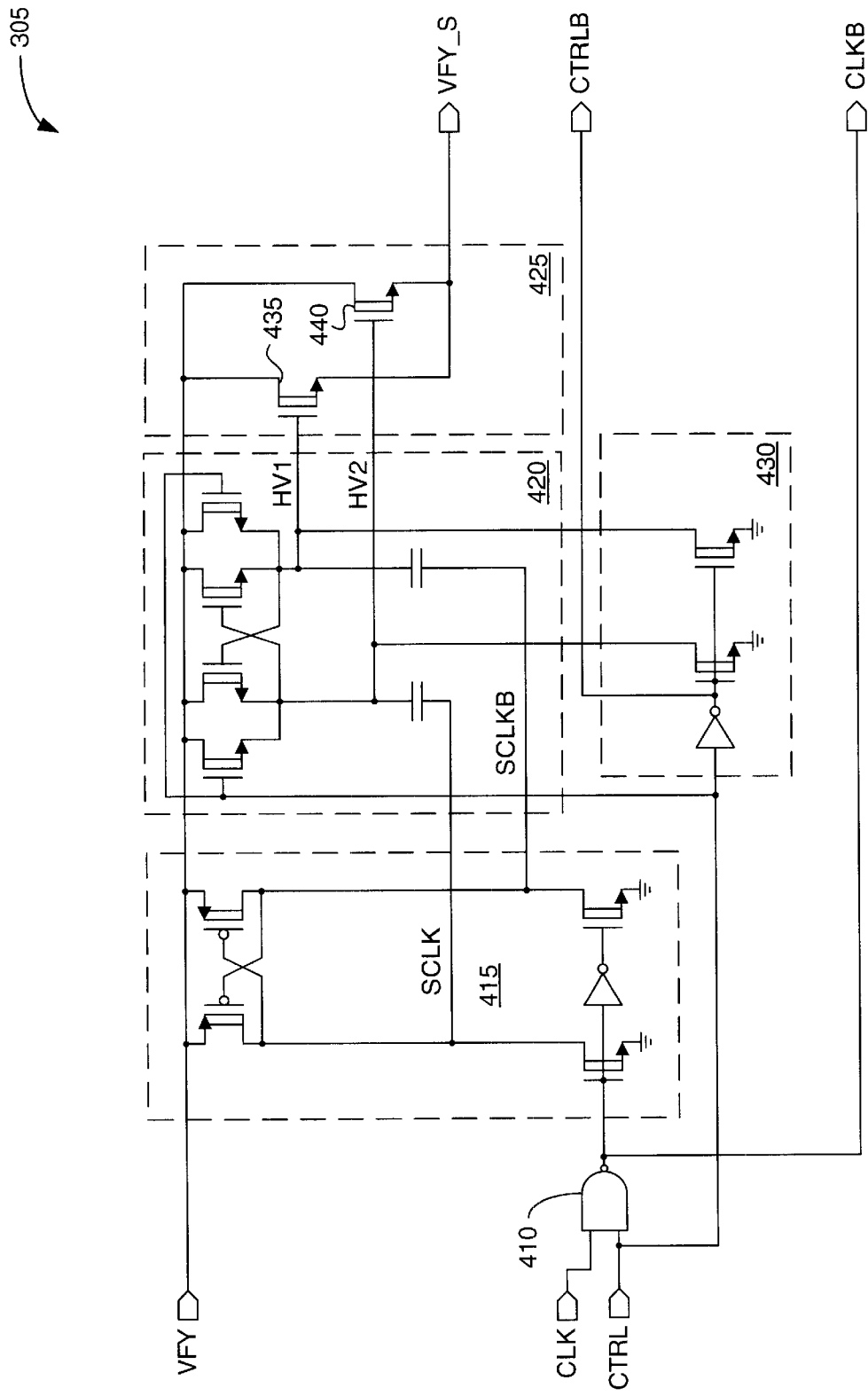
FIG. 4 depicts an embodiment of switch section 305 of FIG. 3.

FIG. 4 depicts an embodiment of switch section 305 of FIG. 3. Switch section 305 includes a NAND gate 410, a level shifter 415, a voltage doubler 420, an output stage 425, and an enable circuit 430. Setting control terminal CTRL to logic one enables switch stage 305. NAND Gate 310 then passes an inverted version of signal CLK to level shifter 315.

During operation, the test voltage VFY can vary between about zero volts and a level well above VDD. The clock and enable signals, on the other hand, are derived from VDD; consequently, level shifter 315 is used to level shift clock signal CLK. The resulting level-shifted clock SCLK and its compliment SCLKB are passed to voltage doubler 420. Voltage doubler 420, an amplifier that provides an output voltage greater than its supply voltage, uses these clock signals as inputs, and verify voltage VFY as a supply voltage, to produce a pair of high-voltage signals HV1 and HV2 to the gates of respective transistors 435 and 440 of output circuit 425. High voltage signals HV1 and HV2 are approximately twice verify voltage VFY, and are therefore sufficiently high that transistors 435 and 440 pass verify voltage VFY as verify voltage VFY_S without appreciable voltage degradation.

Returning control signal CTRL to logic zero removes the clock signal from the input of level shifter 415 and causes enable circuit 430 to pull the gates of transistors 435 and 440 to ground, thereby disconnecting verify voltage terminal VFY from output terminal VFY_S. Enable circuit 430 produces an inverted version of control signal CTRL, CTRLB, for switch section 310.

Figure 5:
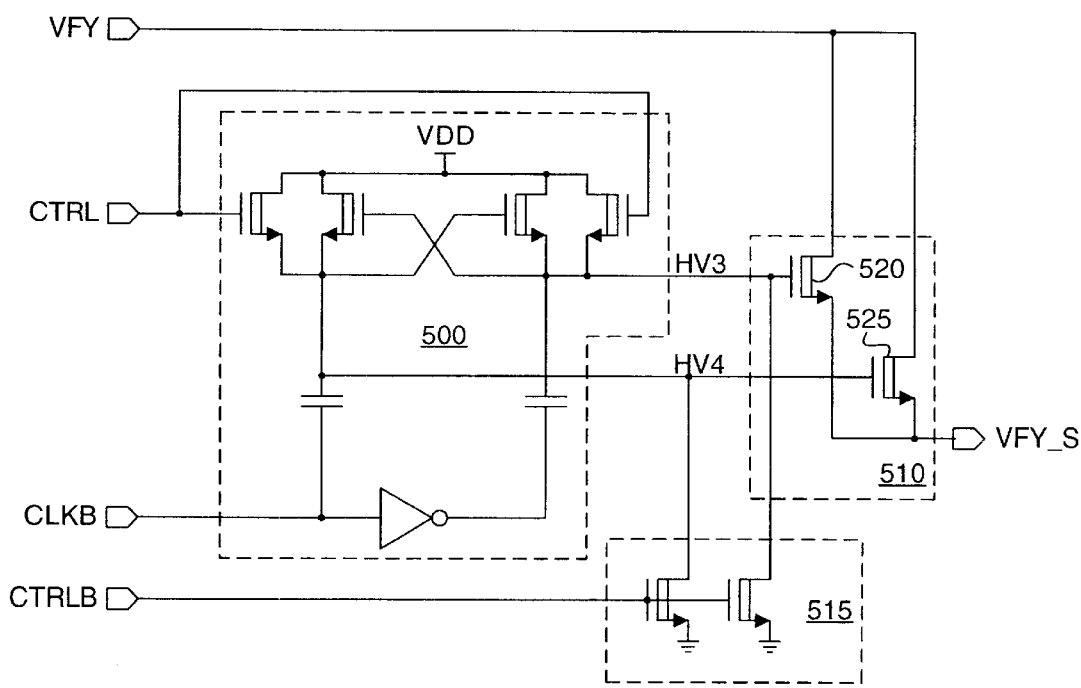
FIG. 5 depicts an embodiment of switch section 310 of FIG. 3.

FIG. 5 depicts and embodiment of switch section 310 of FIG. 3, which passes verify voltage VFY when verify voltage VFY is less than or equal to the supply voltage VDD. Switch section 310 includes a voltage doubler 500, an output stage 510, and an enable circuit 515. Voltage doubler 500 is powered by supply voltage VDD, which is sufficiently high to pass verify voltage VFY when verify voltage VFY is below VDD. Other than the supply voltage, voltage doubler 500 works in the same manner as voltage doubler 420 of FIG. 4 to produce a pair of high-voltage signals HV3 and HV4 to a pair of transistors 520 and 525 in output stage 510. Signals HV3 and HV4 are sufficiently high to allow transistors 520 and 525 to pass verify voltage VFY to terminal VFY_S without an appreciable voltage drop.

When the verify mode is no longer selected, or when steering logic 140 is to select a different memory cell, the control terminal CTRL (FIGS. 3 and 4) is pulled low, causing terminal CTRLB of FIG. 5 to go high. Enable circuit 515 consequently pulls the gates of transistors 520 and 525 to ground. Grounding the gates of the transistors in output circuit 510 disconnects terminal VFY from output terminal VFY_S, thereby making the associated I/O circuit 105 (FIG. 2) available during device operation.

In one embodiment, supply voltage VDD is 1.8 volts and verify voltage VFY can be adjusted anywhere between 0 volts and 4.5 volts. Switch section 305 cannot pass voltages on the lower end of the verify-voltage spectrum, as switch section 305 uses the verify voltage as its supply voltage. In contrast, switch section 310 is supplied by VDD, and consequently cannot pass voltages on the higher end of the verify voltage spectrum. The two switch sections 305 and 310 are therefore connected in parallel so that their combined functionality allows verify voltage VFY to be accurately reproduced at terminal VFY_S regardless of the level of verify voltage VFY.

While the present invention has been described in connection with specific embodiments, variations of these embodiments will be obvious to those of ordinary skill in the art. For example, application of the invention is not limited to the above-described CPLD architecture, or even to CPLDs. Moreover, some components are shown directly connected to one another while others are shown connected via intermediate components. In each instance, the method of interconnection establishes some desired electrical communication between two or more circuit nodes or terminals. Such communication may often be accomplished using a number of circuit configurations, as will be understood by those of skill in the art. Therefore, the spirit and scope of the appended claims should not be limited to the foregoing description.

What is claimed is:

1. A logic device adapted to function as a logic circuit in an operational mode and to be tested in a test mode, the logic device comprising:
   a. a power-supply line adapted to distribute an external power-supply voltage throughout the logic device;
   b. a device pin adapted to receive a variable input signal;
   c. a device input circuit adapted to receive logic signals in the operational mode, the input circuit having:
      i. a power-supply terminal connected to the power-supply line; and
      ii. a device input terminal connected to the device pin; and
   d. a transmitter circuit including:
      i. a transistor having:
         1) a first current-handling terminal connected to the device input pin;
         2) a second current-handing terminal; and
         3) a control terminal; and
      ii. an amplifier having:
         1) an amplifier input terminal connected to the device input pin; and
         2) an amplifier output terminal connected to the transistor control terminal;
         3) wherein the amplifier is adapted to produce, on the amplifier output terminal, an amplifier output voltage greater than the power-supply voltage when the logic device is in the test mode.

2. The logic device of claim 1, wherein the variable input signal exceeds the supply voltage.

3. The logic device of claim 1, further comprising:
   a. a second transistor having:
      i. a third current-handling terminal connected to the device input pin;
      ii. a fourth current-handing terminal connected to the second current-handling terminal of the first-mentioned transistor; and
      iii. a second control terminal; and
   b. a second amplifier having:
      i. a second amplifier input terminal connected to the device input pin; and
      ii. a second amplifier output terminal connected to the second transistor control terminal.

4. The logic device of claim 1, the transmitter circuit further comprising a level-shifter having a level-shifter input terminal connected to the device input pin.

5. The logic device of claim 1, wherein the transmitter circuit further comprises a clock terminal adapted to receive a clock signal.

6. The logic device of claim 1, further comprising a collection of memory cells selectively coupled to the second current-handing terminal of the transistor.

7. The logic device of claim 6, wherein the memory cells are electronically erasable.

8. The logic device of claim 6, wherein the variable input signal comprises a verify signal adapted to verify a program state of the memory cells.

9. A programmable logic device capable of operating in a logic mode and a test mode, the logic device comprising:
   a. an input/output pin adapted to receive a test voltage in the test mode;
   b. a programmable input/output circuit connected to the input/output pin, the programmable input/output circuit active in the logic mode to convey signals via the input/output pin;
   c. a collection of programmable memory cells, a portion of which are adapted to define an input/output function of the programmable input/output circuit; and
   d. a transmitter circuit having a transmitter input terminal connected to the input/output pin, a transmitter output terminal selectively coupled to the collection of programmable memory cells, and a high-voltage terminal adapted to produce a high voltage greater than the test voltage.

10. The programmable logic device of claim 9, wherein the transmitter circuit is adapted to produce an output voltage on the transmitter output terminal, and wherein the test voltage and the output voltage are substantially equal.

11. The programmable logic device of claim 9, further comprising a power-supply line adapted to convey a power-supply voltage throughout the programmable logic device, the transmitter circuit further comprising:
   a. a first switch section connected between the transmitter input terminal and the transmitter output terminal, the first switch section adapted to pass the test voltage when the test voltage is greater than the supply voltage; and
   b. a second switch section connected between the transmitter input terminal and the transmitter output terminal, the second switch section adapted to pass the test voltage when the test voltage is less than the supply voltage.

12. The programmable logic device of claim 1, the first switch section further comprising a transistor having a first current-handling terminal connected to the transmitter input terminal, a second current-handling terminal connected to the transmitter output terminal, and a control terminal.

13. The programmable logic device of claim 1, the first switch section further comprising a capacitance connected to the control terminal and adapted to store a control voltage greater than the test voltage.

14. The programmable logic device of claim 13, the first switch section further comprising a second transistor having a third current-handling terminal connected to the transmitter input terminal, a fourth current-handling terminal connected to the transmitter output terminal, and a second control terminal.

15. The programmable logic device of claim 9, the transmitter circuit further comprising a clock input terminal adapted to receive a clock signal.

* * * * *